United States Patent [19]
Griffith et al.

[11] Patent Number: 5,403,107
[45] Date of Patent: Apr. 4, 1995

[54] CLEANING DEVICE PARTICULARLY FOR PRINTED CIRCUIT BOARDS

[75] Inventors: Louis E. Griffith; Sandra D. Griffith, both of Englewood, Fla.

[73] Assignee: Preleg Inc., Englewood, Fla.

[21] Appl. No.: 171,338

[22] Filed: Dec. 21, 1993

Related U.S. Application Data

[63] Continuation of Ser. No. 965,770, Oct. 23, 1992, abandoned.

[51] Int. Cl.⁶ .............................................. A46B 17/04
[52] U.S. Cl. ................................... 401/271; 401/284; 401/288; 401/290; 401/183
[58] Field of Search ........................ 401/268, 270–274, 401/277, 284–288, 290, 186, 184

[56] References Cited

U.S. PATENT DOCUMENTS

| | | | |
|---|---|---|---|
| 1,030,137 | 6/1912 | Smith | 401/284 |
| 1,190,383 | 7/1916 | Court | 401/290 X |
| 1,641,865 | 9/1927 | Rabalais | 401/271 X |
| 2,726,417 | 12/1955 | Rowser et al. | 401/183 |
| 2,908,926 | 10/1959 | Jockers | 401/272 X |
| 4,447,169 | 5/1984 | Vartoughian | 401/286 X |
| 4,975,159 | 12/1990 | Dahms | 205/125 |

Primary Examiner—Danton D. DeMille
Attorney, Agent, or Firm—Curtis Morris & Safford

[57] ABSTRACT

The cleaning device includes a squeeze-bottle with a spout and a brush extending from the spout. A flow restrictor prevents cleaning fluid from being dispersed from the spout to the brush until the bottle is squeezed. The flow restrictor is formed simply by inserting the twisted wire handle of the brush into a tube forming the outlet of the spout. The length of the tube and the twisted wire can be selected to give the desired amount of flow restriction. The device is particularly well adapted for use in cleaning solder flux and other undesirable substances from printed circuit boards after they have been assembled. The cleaning device is relatively compact, inexpensive to make, and simple to use.

3 Claims, 2 Drawing Sheets

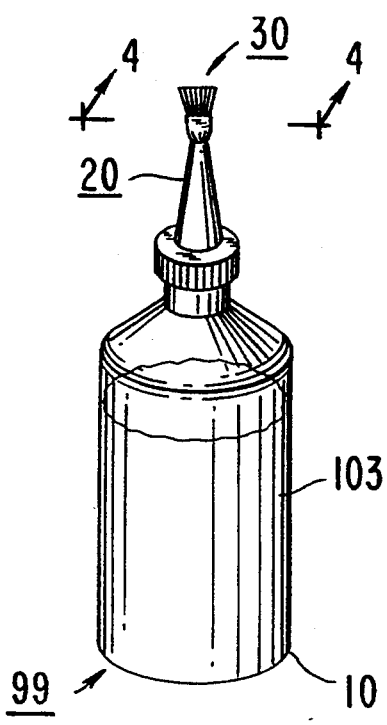
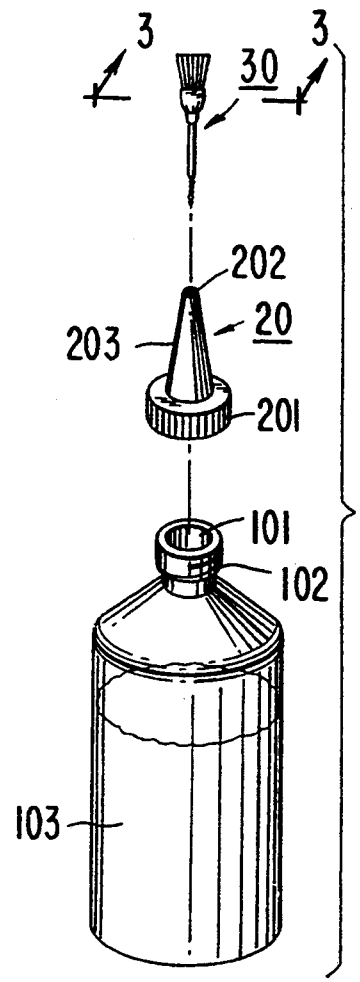
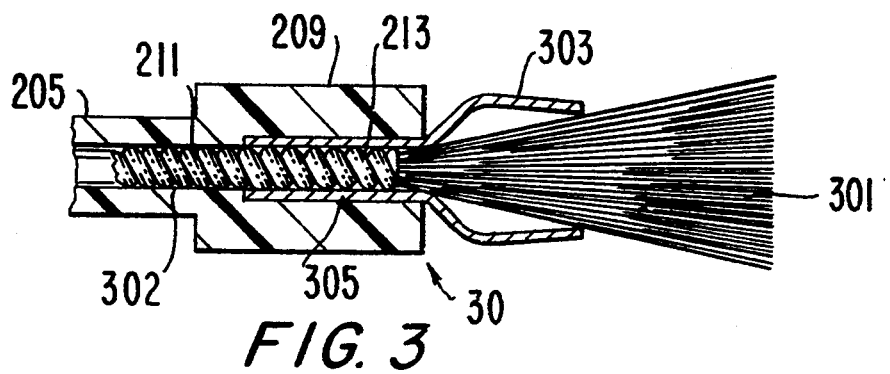

CLEANING DEVICE PARTICULARLY FOR PRINTED CIRCUIT BOARDS

This application is a continuation of application Ser. No. 07/965,770, filed Oct. 23, 1992, now abandoned.

This invention relates to cleaning devices and methods. More particularly, the invention relates to devices and methods for cleaning printed circuit boards.

In printed circuit assembly, solder is used to electrically connect and mount electrical circuit elements on a printed circuit board. Solder flux is used in the soldering process. Rosin is the most commonly-used solder flux material. Rosin contains abietic acids. Any such acids or other ionic materials remaining on the circuit board may create short circuits. Therefore, care should be taken to remove any such materials.

Flux often is removed from printed circuit board assemblies by automatic machine cleaning. However, this method uses chlorofluorocarbon (CFC) FREON-type solvents which have been shown to be environmentally unfriendly. In order to avoid this, manufacturing companies are now using "no clean" and water-soluble solder fluxes. Nevertheless, these manufacturers are finding that some touch-up cleaning with a solvent other than water still is needed. As a result, bench-top "spot cleaning" now is being done.

One device which is used for spot cleaning consists of an aerosol spray can containing a solvent. The outlet of the spray can is connected by a long hose to a hand-held brush. The valve on the spray can is used to regulate the flow of solvents to the brush. Such a device is expensive, bulky, cumbersome and awkward to use. Also, because of the use of aerosol propellant, the devices are not environmentally desirable, despite the fact that they use a non-CFC-type solvent.

Accordingly, it is an object of the present invention to provide a printed circuit board cleaning apparatus and method which solve or substantially alleviate the above-identified problems.

In particular, it is an object of the present invention to provide an environmentally safe printed circuit board cleaning device which is relatively inexpensive to manufacture, buy, and operate, and which is easily and inexpensively refilled and maintained.

It is a further object of the invention to provide such an apparatus which is relatively compact and easy to use.

It is also an object of the invention to provide such an apparatus which is rugged and durable and has a relatively long shelf life.

In accordance with the present invention, the foregoing objects are satisfied by the provision of a printed circuit board cleaning device including a container containing a cleaning fluid, with a restricted outlet communicating with an applicator brush. The container preferably is a flexible squeeze-bottle which can be squeezed to pressurize the fluids in the bottle.

Preferably due to the restricted outlet, liquid will not flow to the brush when the bottle is inverted, but will flow when the bottle is manually squeezed. This gives the user good control over the dispensing of fluid, and allows the user to use the brush to scrub the board without dispensing more fluid until it is needed.

Preferably, the brush is secured to the end of a tapered spout through which the liquid flows to the applicator brush.

Preferably, attached within the spout's upper portion is a tube inside of which is inserted a twisted wire so that the wire fits relatively tightly in the tube. The twisted wire has nylon brush bristles attached to it at one end to form the brush.

The sinuous passageway formed between the twisted wire element and the internal tube wall form a flow restrictor. Thus, when the apparatus is turned upside down, the combination of the twisted wire and the tube allow cleaning fluid to issue forth through the bristles only when the user exerts moderate pressure on the sides of the bottle.

The foregoing and other objects and advantages will be set forth in or apparent from the following drawings.

In the drawings:

FIG. 1 is a perspective view of the preferred embodiment of the printed circuit board cleaning device of the invention;

FIG. 2 is an exploded view of the apparatus shown in FIG. 1;

FIG. 3 is an enlarged cross-sectional view, taken along line 3—3 of FIG. 2;

Figure 4:
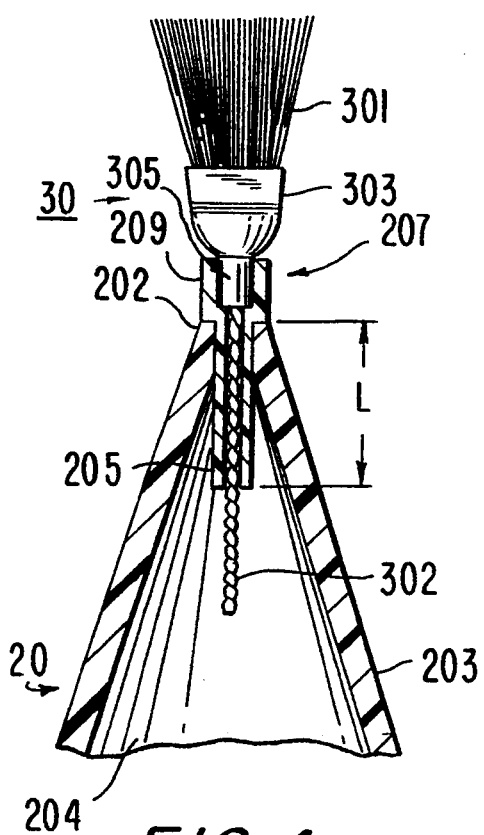
FIG. 4 is a cross-sectional view, taken along the line 4—4 of FIG. 1.

FIGS. 1 and 2 show a cleaning device 99 constructed in accordance with the present invention. The device 99 comprises a flexible squeeze-bottle 10, a spout 20, and a brush 30.

As it is shown in FIG. 2, the bottle 10 has an outlet opening 101 at its top with an externally threaded neck 102. Inside the bottle 10 is a quantity of cleaning fluid 103.

The spout 20 has an internally threaded cap 201 at its lower end, with a frustro-conical tip portion 203 which has a narrow outlet opening 202 at the top. The cap 201 screws onto the bottle neck 102 to form a liquid-tight seal.

FIG. 4 shows that the spout 20 has a hollow interior 204. A plastic tube 205 is fitted into the outlet 202 of the tip 203, and extends into the hollow interior 204.

Referring now to FIG. 3, the brush member 30 has bristles 301 attached to a twisted wire 302. A ferrule 303 is crimped around the juncture of bristles 301 and the twisted wire 302.

Advantageously, the structure shown in FIG. 3 is that of a conventinal brush, formed by wrapping a wire around a bundle of fibers and twisting the wire. The ferrule 303 bends and shapes the bristles into a brush. This brush is made in large quantities for other uses, and is therefore relatively inexpensive.

As FIG. 4 indicates, the brush member 30 is fastened to the spout 20 by inserting the twisted wire handle 302 into the plastic tube 205 into the outlet 202 of the spout. The spout 203 preferably is a conventional "Yorker" spout which is widely available and relatively inexpensive.

The tube 205 is part of a brush holder structure 207 which includes an enlarged ferrule receptacle 209 integral with the tube 205 and having an outer diameter about the same diameter as the outside of the tip of the spout 203. The internal diameter of the receptacle 209 is such that the shank 305 of the ferrule fits into it with an interference fit so as to hold the ferrule in place.

The brush assembly 30 can be removed easily by pulling it out of the receptacle. It then can be cleaned and replaced simply by re-inserting the wire handle 302 through the tube 205 and the ferrule shank 305 into the receptacle 209. The same procedure can be used to replace the brush assembly 30 with a new one, if needed.

The brush holder structure 207 is secured to the tip of the spout by an adhesive resistant to attack by the cleaning fluid in the bottle. Thus, the brush is mounted securely on the bottle spout so that it will stay solidly in place when the brush is used to scrub the surface of a circuit board.

As it is shown in FIG. 3, the twisted wire handle 302 of the brush forms a spiral restricted flow path 211 to conduct fluid from the bottle through the similarly restricted space 213 between the shank 305 of the ferrule 303 to the bristles 301 of the brush.

Referring again to FIG. 4, the degree of restriction of the outlet of the bottle provided by the spiral flow paths 211 and 213 can be varied by changing the length L of the tube 205, thus changing the length of the spiral flow path. The preferred cleaning fluid has about the same viscosity as water. If a different, more viscous fluid is used, the length L can be reduced to keep the amount of squeezing pressure needed to a reasonably low level. If a fluid with lower viscosity is used, the length L can be increased to avoid unwanted discharge of liquid from the bottle, The squeeze-bottle 10 preferably is relatively small so that it fits easily in the hand of the user. When the bottle 10 needs refilling, this can be done easily by unscrewing the spout cap 201 (FIG. 2), filling the bottle 10 from a larger container, and replacing the spout.

Figure 6:
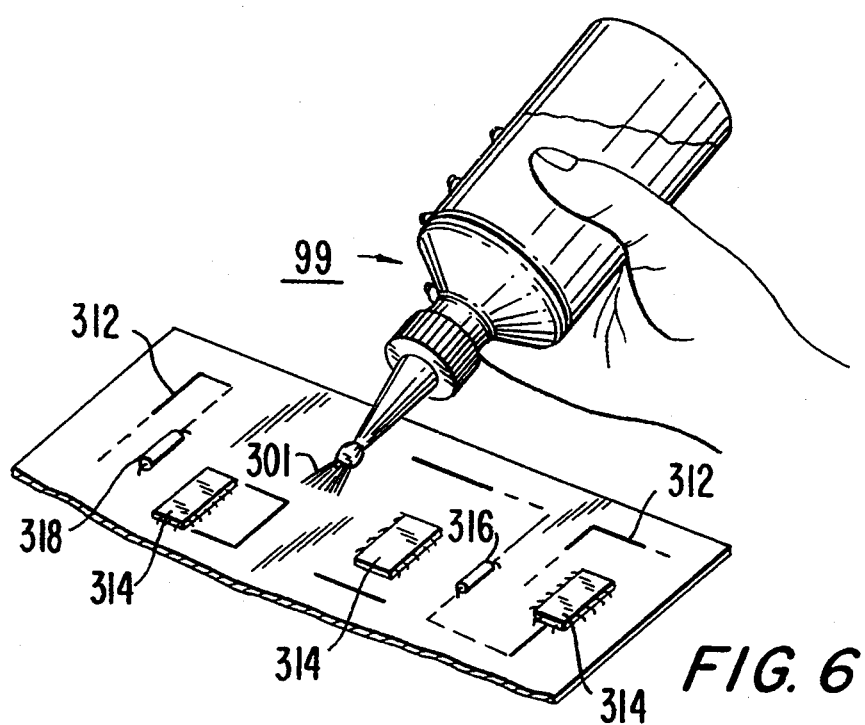
FIG. 6 is a perspective view of the device of FIG. 1 shown in use to clean a printed circuit board.

FIG. 6 shows the cleaning device 99 in use in cleaning a printed circuit board 310 bearing printed conductors 312 and circuit elements such as integrated circuit chips 314, resistors 316, capacitors 318, etc.

The bottle is inverted so that cleaning fluid 103 enters the hollow interior 204 of the spout 20. By squeezing the bottle manually with relatively light pressure, the fluid is pressurized and flows through the tube 205 past the twisted wire 302 and into the bristles 301 of the brush. The cleaning fluid then is brushed onto the printed circuit board 310 to dissolve and remove solder flux or other residue. The brush can be used to scrub the surface of the board to loosen stubborn materials. Then, the fluid can be allowed to evaporate and the residue either can be wiped off with a dry cloth or it can be allowed to remain on the board.

Figure 5:
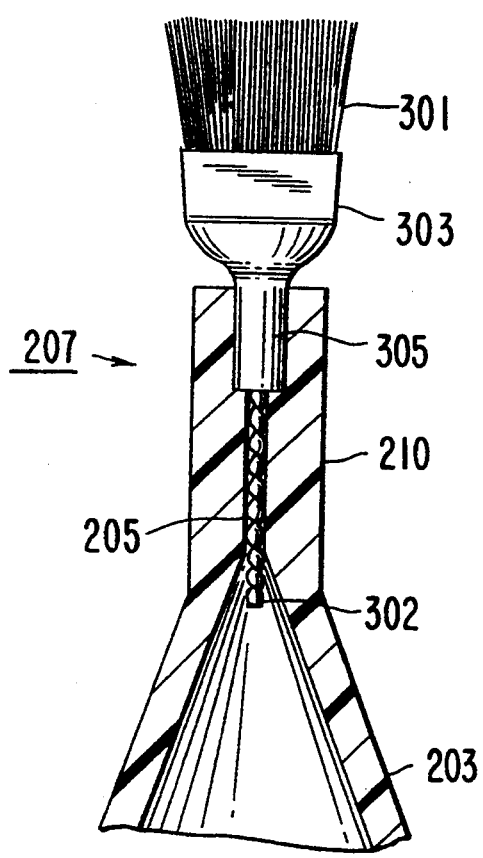
FIG. 5 is a cross-sectional view showing an alternative embodiment of the invention.

FIG. 5 shows an alternative embodiment of the invention which is the same as those shown in FIGS. 1 through 4 and 6 except that the brush holder 207 is made integral with the tip of the spout instead of as a separate element. The tube 205 is formed in the material of the spout, as is the receptacle for the shank 305. This structure reduces manufacturing costs when the product is made in relatively large quantities.

The preferred circuit board cleaning fluid formulation contains approximately 60% terpenes and 40% polyglycol ether, with about 2% by weight of added non-ionic wetting agents. This formulation is environmentally safe and has a pleasing citrus scent.

Preferably, the squeeze bottle is formed from a relatively flexible plastic, such as low-density polyethylene (LDPE), with the polymer fluorinated so as to make it chemically resistant to hydrocarbon solvents that may be in the cleaning fluid. Preferably, the spout 20 also is formed from such a fluorinated polymer, although the flexibility required in the squeeze bottle is not required here. The tube 205 preferably is made of nylon.

As it is noted above, the squeeze bottle 10 desirably is of such a dimension that it can easily and comfortably be held in the user's hand, especially when the bottle is squeezed. For example, the bottle may have a volume of 4 ounces, a height of 4 or 5 inches, and a diameter of 2 inches.

The twisted wire attached to the brush bristles is composed of stainless steel or some other material chemically resistant to the cleaning fluid. It is preferable that the twisted wire's diameter be only slightly smaller than the inside diameter of the inserting tube, so that the wire fits snugly within the tube. For example, in a device which has been built and used successfully, the inside diameter of the tube is 0.060 inches, while the diameter of the twisted wire is 0.058 inches. The tube 205 is approximately 1 or 1¼ inches in length when the preferred cleaning fluid is used.

The device described above and shown in the drawings is highly advantageous and satisfies the objectives set forth above.

The device is relatively easy and inexpensive to manufacture. It uses components which are readily available.

The device is simple to use, and because it is small and hand-held, it takes up little space at the user's workstation and is not cumbersome to use. The device is easy to take apart to clean or to replace the brush, and is easy to refill.

The device is capable of using environmentally acceptable cleaning fluids and does not use an environmentally undesirable spray can propellant.

Although the invention has been described in use in cleaning printed circuit boards, it should be understood that it can be used in cleaning many other different types of surfaces, and is particularly advantageous when cleaning is needed in tight spaces. For example, with an appropriate cleaning fluid, the cleaning device can be used for cleaning between and around the keys of computer keyboards, telephone keypads, and similar places in complex equipment.

This invention can be practiced in many different forms other than the specific forms described above. Those specific forms are described in order to set forth the best modes presently contemplated for carrying out the invention. However, the protection of this patent shall not be limited to those forms and should be interpreted to cover other cleaning devices utilizing the spirit and contribution of the invention.

What we claim is:

1. A cleaning device comprising:
   (a) a squeeze bottle having an outlet aperture and adapted to contain a cleaning fluid;
   (b) a tapered spout having a relatively small outlet opening at one end, and a relatively large inlet opening at the opposite end, said spout being secured to said bottle with said inlet opening in communication with said outlet aperture;
   (c) a tube fitted into said outlet opening in said spout; and
   (d) a brush assembly comprising a twisted wire support member inserted into said tube, brush bristles attached to said twisted wire support member and forming a brush, and a ferrule crimped around the juncture of said bristles and said wire, with said twisted wire support member having a diameter slightly smaller than the inside diameter of said tube, and said wire forming a spiral groove while maintaining a relatively close fit inside said tube so as to form a spiral flow restrictor within said tube.

2. A device as in claim 1 in which said bottle contains a cleaning fluid comprising terpenes and polyglycol ether.

3. A device as in claim 1, said tube is long enough so that said cleaning fluid does not leak from said bottle under gravity when said bottle is inverted, but not so long that inordinate pressure on said squeeze bottle is required to discharge said cleaning fluid into said brush.

* * * * *